United States Patent [19]
Wilson

[11] Patent Number: 5,313,205
[45] Date of Patent: May 17, 1994

[54] METHOD FOR VARYING THE INTERPOLATION RATIO OF A DIGITAL OVERSAMPLING DIGITAL-TO-ANALOG CONVERTER SYSTEM AND APPARATUS THEREFOR

[75] Inventor: James Wilson, Sharon, Mass.

[73] Assignee: Analog Devices, Inc., Norwood, Mass.

[21] Appl. No.: 43,408

[22] Filed: Apr. 6, 1993

[51] Int. Cl.$^5$ .............................................. H03M 1/66
[52] U.S. Cl. .................................... 341/144; 341/143
[58] Field of Search .............................. 341/132, 144

[56] References Cited
U.S. PATENT DOCUMENTS

| | | | |
|---|---|---|---|
| 4,542,369 | 9/1985 | Kasuga | 341/144 |
| 4,890,106 | 12/1989 | Belcher | 341/144 |
| 5,061,925 | 10/1991 | Sooch et al. | 341/120 |
| 5,157,396 | 10/1992 | Yoshio | 341/144 |

Primary Examiner—Marc S. Hoff
Attorney, Agent, or Firm—Wolf, Greenfield & Sacks

[57] ABSTRACT

A digital oversampling digital-to-analog converter system includes an interpolator, a sigma-delta modulator, a digital-to-analog converter and a low pass filter. The interpolator receives a digital input signal and upsamples the input signal by certain upsampling factor. The upsampled signal is processed by the sigma-delta modulator, converted to an analog signal by the digital-to-analog converter and then filtered by the low pass filter. The interpolator includes control circuitry, preferably a central processor, which controls the upsampling factor and increases the upsampling factor upon a decrease in the frequency of the input signal.

20 Claims, 5 Drawing Sheets

METHOD FOR VARYING THE INTERPOLATION RATIO OF A DIGITAL OVERSAMPLING DIGITAL-TO-ANALOG CONVERTER SYSTEM AND APPARATUS THEREFOR

FIELD OF THE INVENTION

The present invention relates to a method and apparatus for varying the oversampling rate of a digital-to-analog converter (hereinafter "DAC") system and, more particularly, to a method and apparatus for varying the interpolation ratio of an interpolator within a sigma-delta DAC system.

BACKGROUND OF THE INVENTION

In the fields of digital audio and telecommunications, among others, it has become increasingly desirable, in converting from digital to analog signals, to produce analog signals of low distortion and noise. This desire has led to the common use of DACs which perform "digital oversampling". "Digital oversampling" is a technique by which there is provided from a digital input signal of a certain resolution, provided at a first rate, a second digital signal of like resolution but at a second rate which is significantly greater than the first rate. Typically, a digital oversampling element receives a digital input having an input sampling rate and outputs digital samples at a greater rate than the input sampling rate. "Analog oversampling", by contrast, is a technique in which an analog signal is sampled at greater than the Nyquist rate. Analog oversampling is commonly performed in analog-to-digital converters.

Digital oversampling DACs typically utilize sigma-delta architecture. DACs utilizing sigma-delta architecture commonly include an interpolator which receives a digital input signal and increases the sampling rate (typically 64 times the input frequency) of the digital input signal, producing a higher frequency output signal. A sigma-delta modulator receives this higher frequency output signal from the interpolator and converts the received signal to a lower accuracy (typically one bit), high frequency signal. Additionally, the sigma-delta modulator performs "noise shaping" on the signal input thereto. "Noise shaping" is a technique by which the noise spectrum of a signal is manipulated and most of the noise power is moved to a frequency band substantially outside of the signal bandwidth. The sigma-delta modulator essentially acts as a high pass filter to quantization noise and a low pass filter to the input signal. This process, referred to as "sigma-delta modulation", is purely a digital process for a DAC.

The one-bit data stream output by the modulator is converted to an analog signal and fed to a low pass filter which acts to filter out some of the high frequency quantization noise. The resulting output signal is a low distortion signal with a very low in-band (i.e., signal bandwidth) noise component, desirable for most applications.

With prior art sigma-delta DAC systems, if a user intends to reduce the input sampling frequency by a certain factor to suit a particular application (i.e., from a digital audio application to a telecommunications application), the user must change the system clock frequency by the same factor. In other words, the operating frequency of the sigma-delta modulator has to be reduced to handle the reduction in the input signal frequency. The result of the reduction in the operating frequency of the modulator is that the shaped quantization noise resides in a lower frequency band.

In a typical digital audio application, such as a compact disc player, the input signal has a relatively high input sampling frequency (for example, 44 kHz) and, thus, the quantization noise is shaped within a frequency band substantially outside of the audible frequency range (assuming an interpolation ratio of 64). When the input sampling frequency is reduced (to a rate such as 5.5 kHz), to suit a telecommunications application, a corresponding reduction in the operating frequency of the modulator results in the quantization being shaped substantially within the audible frequency range. This result presents a clear problem as it is undesirable to have a high level of noise within the audible range for a telecommunications application.

One potential solution to this problem, as used in prior art approaches, is to use a complex filter (i.e., high order filter) to reduce the quantization noise to either an inaudible level or a level suitable for a particular application. A drawback to this solution, however, is that such a filter is much more costly to implement than a more simple filter.

Another potential solution to this problem, as used in prior art approaches, is to increase the oversampling ratio of the system for all input sampling rates. A drawback to this solution, however, is the extremely high clock rates of certain components necessitated by high input sampling rates.

Accordingly, a general purpose of the present invention is to provide an improved oversampled sigma-delta DAC system having a modulator which maintains operation at a relatively high clock frequency despite a substantial reduction in the input sampling frequency.

Another purpose of the present invention is to provide such a system in which the modulator shapes quantization noise in a substantially inaudible frequency range despite a reduction in the input sampling frequency.

SUMMARY OF THE INVENTION

The aforementioned problems and drawbacks are overcome by a method and apparatus of the present invention in which the interpolation ratio of an interpolator in a DAC system is controlled such that quantization noise is moved substantially outside of the signal passband.

More particularly, according to the invention, an interpolator receives a digital input signal having an input sampling frequency and outputs an upsampled digital signal. The interpolator has an interpolation ratio (equal to the ratio of the sampling frequency of the interpolator output to the interpolator input sampling frequency) and includes control circuitry to set the interpolation ratio such that quantization noise is moved substantially outside of the signal passband. An oversampled modulator, coupled to the interpolator, receives the upsampled signal and outputs a noise-shaped n-bit digital stream. An n-bit DAC receives the n-bit digital stream and converts that stream to an analog signal. A low pass filter, coupled to the n-bit DAC, receives the analog signal and reduces high frequency quantization noise.

In accordance with a preferred embodiment of the present invention, when the input sampling frequency decreases by a certain factor, the interpolation ratio is increased by substantially the same factor.

Additionally, in accordance with a preferred embodiment of the present invention, the interpolator includes at least one upsampling element which receives the digital input signal and upsamples that signal, and at least one low pass filter which filters the upsampled signal. A central processor, coupled to the at least one low pass filter, controls the clock rates of the at least one low pass filter and the modulator to control the upsampling rates of the individual upsampling elements and the overall interpolation ratio.

Other advantages, novel features and objects of the invention will become apparent from the following detailed description of the invention when considered in conjunction with the accompanying drawings.

DETAILED DESCRIPTION

Figure 1:
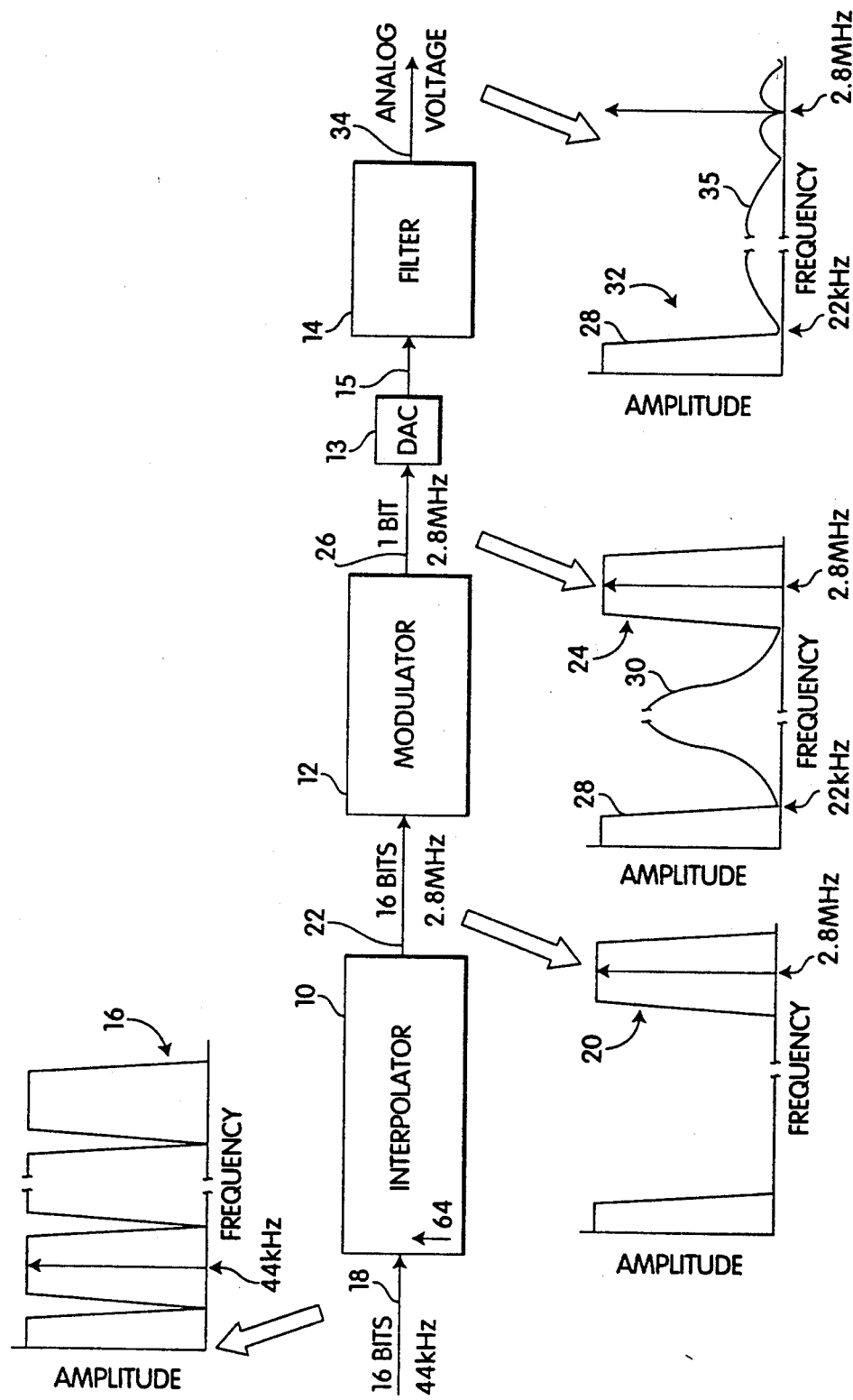
FIG. 1 is a block diagram of a prior art sigma-delta DAC system for a relatively high input sampling frequency application and signal graphs showing signals at various locations within the system.

Referring to FIG. 1, a block diagram of a prior art sigma-delta DAC system is shown. In addition, the amplitude/frequency spectra of various signals within the system are shown.

The system includes an interpolator 10, a sigma-delta modulator 12, a DAC 13, and a low pass filter 14. An input signal with spectrum 16 is received by the interpolator 10 on input terminal 18. The system shown is for a compact disc player application in which the digital input signal 16 is a 16-bit signal having an input sampling frequency of 44.1 kHz. The interpolator, for this application, upsamples the input signal 18 by a factor of 64 (the interpolator has an "interpolation ratio" or "upsampling factor" of 64). The output signal of the interpolator, with spectrum 20, has an increased sampling frequency of 2.8224 MHz. The output signal 20 is also a 16-bit signal and is fed on line 22 to modulator 12. In addition to increasing the sampling frequency of the input signal 16, the interpolator 10 filters out images between the baseband frequency and 2.8224 MHz, the output signal frequency.

Output signal 20 is then processed by the sigma-delta modulator 12, operating at a rate of 2.8224 MHz, which preferably outputs a one bit digital stream, with spectrum 24. Note, however, that the sigma-delta modulator may be greater than a one-bit modulator, depending on accuracy requirements, etc. The sigma-delta modulator conventionally performs noise shaping on the signal 20, providing an output signal 24 having a low frequency signal component and a high frequency quantization noise component. The signal 24 includes a signal component 28 residing between 0 and 22 kHz, the passband, and a quantization noise component 30 residing substantially within the frequency range between 22 kHz and approximately 2.8 MHz. The approximate upper limit on the quantization noise range, 1.411 MHz, is equal to the clock rate (operating frequency) of the sigma-delta modulator minus the width of the input signal passband.

The one bit digital output stream 24 is then provided to one bit DAC 13 on line 26 where it is conventionally converted into a sequence of analog "ones" and "zeros". The analog output signal of the DAC 13 is provided on line 15 to low pass filter 14 which reduces the large amount of quantization noise at higher frequencies. Note that the low pass filter 14 does not actually eliminate the quantization noise 30, but simply reduces it to acceptable levels to suit the particular application (i.e., so that the signal can subsequently be handled by other components such as loudspeakers, etc.). Complete elimination of the quantization noise 30 is not necessary in the particular application of FIG. 1 because the quantization noise substantially resides within an inaudible frequency range, above the audible range (i.e., above 20 kHz).

Low pass filter 34 provides an output signal, having a spectrum 32, on output terminal 34. As shown, the output signal 32 includes a signal component 28 and a filtered quantization noise component 35 substantially outside the audible frequency range. The output signal 32 has a high signal-to-noise ratio in the audible frequency range and most of the noise resides outside of the audible frequency range.

Figure 2:
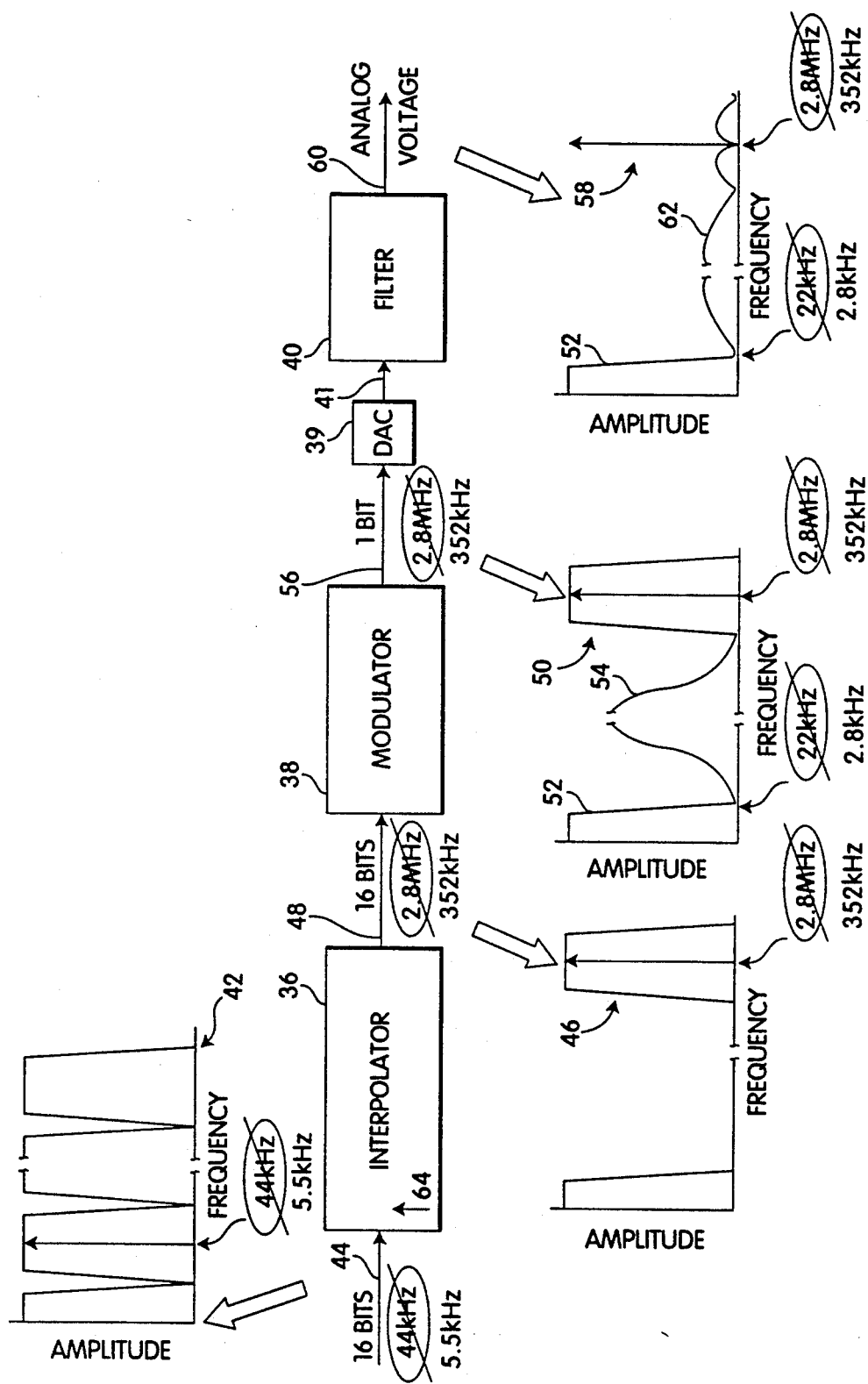
FIG. 2 is a block diagram of a prior art sigma-delta DAC system for a relatively low input sampling frequency application with signal graphs showing signals at various locations within the system.

FIG. 2 shows a prior art sigma-delta DAC system for a telecommunications application. In such a prior art system, if the input sampling frequency is reduced by a certain factor, the clock frequency at which the modulator operates is also reduced by the same factor (note that the modulator operates at the frequency of the signal input thereto).

As shown in FIG. 2, the system includes an interpolator 36, a sigma-delta modulator 38, a DAC 39, and a low pass filter 40. Like FIG. 1, the amplitude/frequency spectra of various signals throughout the system are shown. In addition, the frequencies of the various signals of FIG. 1 are listed above the frequencies of the corresponding signals of FIG. 2 and are circled and crossed out. These markings are to illustrate the difference in frequencies between the signals of FIG. 1 and the signals of FIG. 2.

Like the system of FIG. 1, the interpolator 36 receives a digital input signal, with spectrum 42, on an input terminal 44. In this particular application, the input signal 42 is a 16-bit digital signal having an input sampling frequency of 5.5 kHz. From the input signal 16 of the compact disc player application, described above with reference to FIG. 1, a reduction by a factor of eight has occurred in the input sampling frequency.

The interpolator filter 36 has an interpolation ratio of 64, the same as that of interpolator 10 in the application of FIG. 1. The output signal, with spectrum 38, of interpolator 36, therefore, has a frequency of 352 kHz, a factor of one-eighth that of the corresponding signal of FIG. 1. This signal 38 is fed on line 48 to modulator 38 which operates at 352 kHz (remember that the modulator operates at the frequency of the signal input thereto). The output signal, with spectrum 50, of the modulator 38 is thus a one-bit digital stream having a frequency of 352 kHz. As shown, signal 50 has a signal component 52 which lies between 0 and 2.8 kHz, the passband, and a quantization noise component 54 which resides in a band having a lower limit of approximately 2.75 kHz, substantially within the audible frequency range.

As in FIG. 1, signal 50 is fed on line 56 to one-bit DAC 39 which converts signal 50 to an analog signal which, in turn, is provided to low pass filter 40 on line 41. Low pass filter 40 reduces the high frequency quantization noise. The output signal, with spectrum 58, of low pass filter 40 is provided on output terminal 60. As shown, the output signal 58 includes a signal component 52 and a quantization noise component 62, residing substantially within the audible frequency range. While the low pass filter reduces the quantization noise level somewhat, the level of noise remaining in the audible range after filtering is unacceptable for most applications. To reduce the amount of quantization noise to an acceptable level, as previously discussed, a complex and more costly filter would have to be used.

Figure 3:
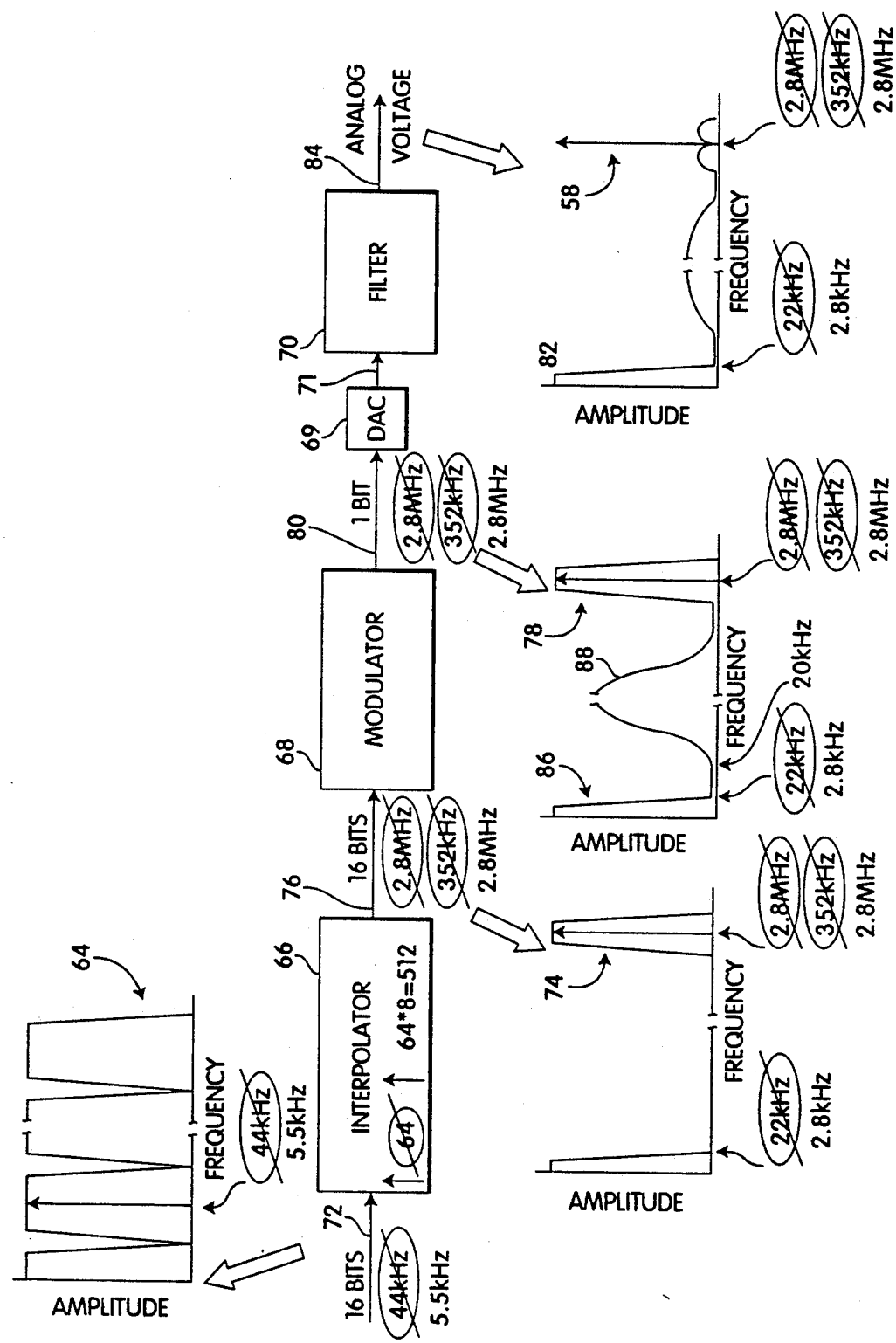
FIG. 3 is a block diagram of the sigma-delta DAC system of the present invention for a relatively low input signal sampling frequency application and signal graphs showing signals at various locations within the system.

FIG. 3 shows a DAC system according to the present invention. The system includes a variable rate interpolator which controls the modulator clock rate. In this manner, the quantization noise frequency range can be controlled to produce signals with low noise components in the signal bandwidth without the need for complex and more costly filtering circuitry.

The system of FIG. 3 is shown for a telecommunications application having a digital input signal, with spectrum 64, and an input sampling frequency of 5.5 kHz, like the input signal 42 of the application of FIG. 2. Like FIGS. 1 and 2, the amplitude/frequency spectra of various system signals are shown.

Similar to the embodiments shown in FIGS. 1 and 2, the system of FIG. 3 includes an interpolator 66, a sigma-delta modulator 68, a DAC 69, and a low pass filter 70. The interpolator 66 receives a digital input signal 64 on an input terminal 72, oversamples this digital input signal and provides an oversampled output signal, with spectrum 74, on line 76 to the sigma-delta modulator 68. The sigma-delta modulator 68 converts the output signal 74 to a one-bit digital stream and provides noise shaping. The output signal, with spectrum 78, of modulator 68 is provided on line 80 to one-bit DAC 69 where it is converted to an analog signal and provided on line 71 to low pass filter 70. Low pass filter 70 reduces high frequency quantization noise. Low pass filter 70 is preferably of a switched-capacitor implementation. The output signal of low pass filter 70, with spectrum 82, is provided on output terminal 84.

With the interpolator 66 of the present invention, when the input sampling rate is reduced by a certain factor, the interpolation ratio is increased by a certain amount, preferably the same factor. This increase provides a corresponding increase in the operating frequency of the modulator which results in an increase in the frequency range within which the quantization noise is shaped.

In the example shown in FIG. 3, the input sampling frequency is reduced from 44 KHz to 5.5 KHz—i.e., by a factor of eight. The interpolation ratio is, in response, increased from 64 to 512—that is, by the same factor of eight. As such, the output signal 74 of interpolator 66 has a frequency of 2.8 MHz. Thus, the modulator 68 operates at a frequency of 2.8 MHz. Therefore, the one-bit digital stream 78, output by modulator 68, as shown in FIG. 3, includes a signal component 86 residing within the frequency signal passband of 0 to 2.228 kHz, and quantization noise component 88 residing substantially within the frequency band of 20 kHz to approximately 2.8 MHz. The quantization noise is substantially outside of the audible frequency range. The quantization noise frequency range has been broadened by the increase in the operating frequency of the modulator. This broadening of the frequency range also increases the lower limit of the range where the majority of the quantization noise lies (note that the lower limit has been increased from approximately 2.8 kHz to 20 kHz).

The advantages provided by the increase in the interpolation ratio include that the quantization noise is shaped substantially in (i.e., mostly moved to) an inaudible frequency range. This result eliminates the need for more costly high order filters to reduce the noise. However, low pass filter 40 is, nonetheless, preferably a switched-capacitor filter, in which the frequency response is scaled with the system clock frequency. Such a switched capacitor filter efficiently reduces the high frequency quantization noise to acceptable levels.

Figure 4:
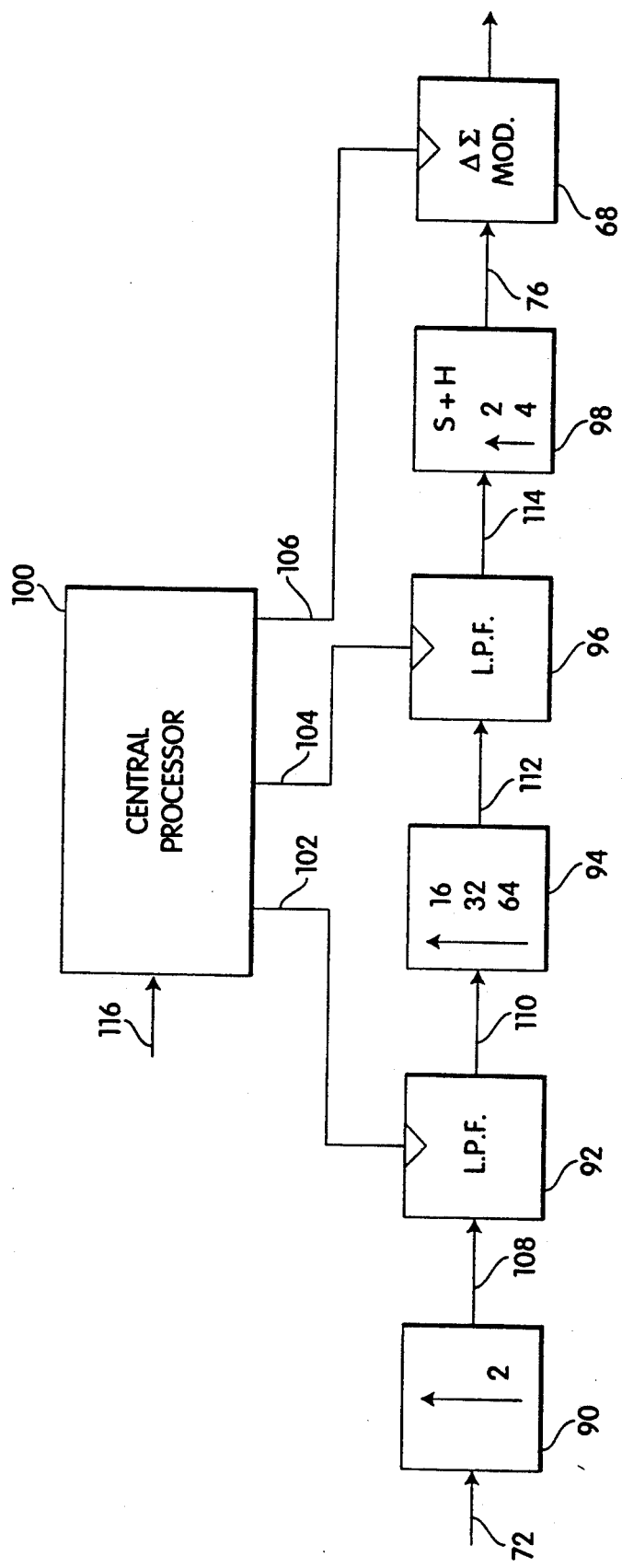
FIG. 4 is a functional block diagram of an interpolator according to the present invention.

Further details of the interpolator 66 of the present invention are shown in the block diagram of FIG. 4. It should be appreciated that FIG. 4 is a functional block diagram in which conceptual elements are shown to illustrate their function although certain elements do not physically exist. As shown, the interpolator 66 includes an upsample by two element 90, a first low pass filter 92, an upsample by 16, 32, or 64 element 94, a second low pass filter 96, a sample and hold circuit (which upsamples by two or four) 98, and a central processor 100. The central processor 100 includes control lines 102, 104 and 106 connected to the first low pass filter 92, the second low filter 96, and the sigma-delta modulator 68, respectively, for controlling the clock frequencies thereof. The central processor 100 additionally controls the characteristic of the second low pass filter 96.

During operation, the digital input signal is received on input terminal 72 by upsample by two element 90 which conventionally upsamples the input signal by two (i.e., provides one word of all zeros between each sample) and provides the upsampled signal on line 108 to low pass filter 92 which, in turn, filters the signal and provides the filtered signal to upsample by 16, 32, or 64 element 94. Depending on the clock frequency of the second low pass filter 96, which is controlled by central processor 100, element 94 upsamples the signal by 16, 32, or 64 and provides the upsampled signal on line 112 to the second low pass filter 96. The second low pass filter 96 filters the signal and provides the same on line 114 to the sample and hold circuit 98. The sample and hold circuit 98 operates conventionally and upsamples by either two or four depending on the clock frequency of the modulator 68, which is also controlled by the central processor 100. The sample and hold circuit provides an output signal on line 76 to the sigma-delta modulator 68. The three upsampling elements are connected in series and the product of their upsampling rates yields the interpolation ratio of the interpolator.

Note that the upsampling rates of element 94 and sample and hold circuit 98 depend upon the clock frequencies of the second low pass filter 96 and sigma-delta modulator 68, respectively, which are controlled by the central processor 100. Therefore, the upsampling rates of these elements and, thus, the interpolation ratio, is directly controlled by the central processor 100. In other words, the central processor 100 controls the clock rate of the low pass filters 92, 96, as well as the sigma-delta modulator 68, to achieve an overall interpolation ratio appropriate for the particular application. The central processor 100 is preferably a microprocessor which receives information relating to the input signal (including the input sampling frequency) and implements a software routine to control the clock frequencies as described.

As previously discussed, if the input sampling frequency is reduced by a certain factor, the interpolation ratio, in turn, is increased, preferably by the same factor. Thus, the central processor, in response to a change in the input signal sampling frequency, changes the clock frequencies of the low pass filter and modulator to achieve the appropriate change in the interpolation ratio.

Figure 5:
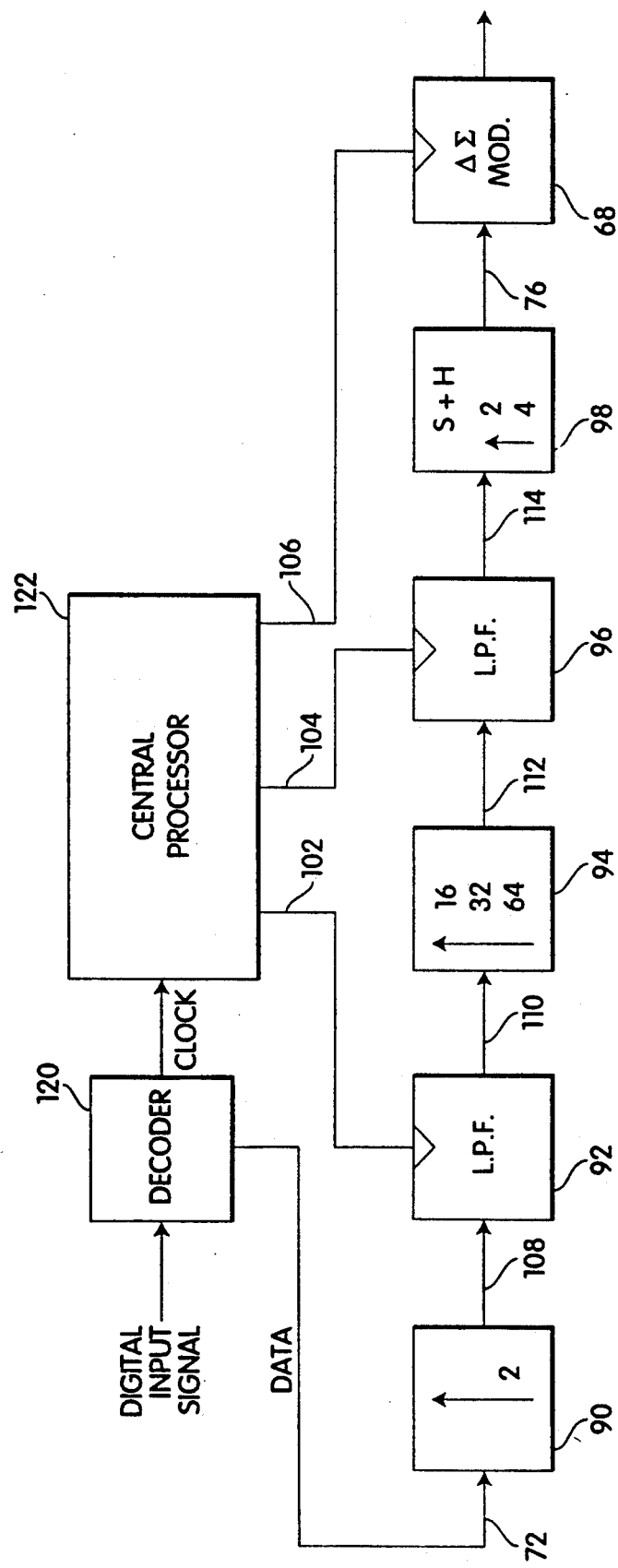
FIG. 5 is a functional block diagram of an alternate embodiment interpolator according to the present invention.

In a preferred embodiment of the present invention, the central processor includes an input terminal 116 through which a user may communicate with the central processor to input data relating to the digital input signal, such as the input sampling frequency. Please note, however, that it is envisioned that control circuitry such as a phase-locked-loop or other such arrangement may be used to determine the input sampling frequency, and provide that frequency to the central processor. For example, if the digital input signal is encoded using a self-clocking code, an appropriate decoder (FIG. 5, element 120) of conventional design can be used to decode the bit values and to extract a clock signal. In turn, the central processor 122 can determine the rate of that clock signal and suitably select the interpolation ratio.

Below are two tables listing, for various input sampling frequencies, the corresponding preferred upsampling ratios of elements 90, 94 and 98, and the overall interpolation ratio. Table 1 assumes a master clock frequency of 24.576 MHz while Table 2 assumes a master clock frequency of 16.9344 MHz. Note, however, that the figures listed in these tables are examples only and can be changed to suit a particular DAC system circuit arrangement or application.

TABLE 1

| Input Sampling Frequency (kHz) | Interpolation Ratio | Upsampling Ratios | | |
|---|---|---|---|---|
| | | element 90 | element 94 | sample & hold 98 |
| 8 | 256 | 2 | 64 | 2 |
| 9.6 | 256 | 2 | 64 | 2 |
| 16 | 128 | 2 | 32 | 2 |
| 27.428 | 64 | 2 | 16 | 2 |
| 32 | 64 | 2 | 16 | 2 |
| 48 | 64 | 2 | 16 | 2 |

TABLE 2

| Input Sampling Frequency (kHz) | Interpolation Ratio | Upsampling Ratios | | |
|---|---|---|---|---|
| | | element 90 | element 94 | sample & hold 98 |
| 5.5125 | 512 | 2 | 64 | 4 |
| 6.615 | 256 | 2 | 64 | 2 |
| 11.025 | 256 | 2 | 64 | 2 |
| 18.9 | 128 | 2 | 32 | 2 |
| 22.05 | 128 | 2 | 32 | 2 |
| 33.075 | 64 | 2 | 16 | 2 |
| 37.8 | 64 | 2 | 16 | 2 |
| 44.1 | 64 | 2 | 16 | 2 |

Thus, the present invention provides a variable interpolation ratio interpolator for use with a sigma-delta DAC system. The advantages offered by the present invention include that the system may be used for a wide variety of applications and provides low distortion, high in-band signal-to-noise ratio signals without the need for complex filtering circuitry.

While the invention has been described herein with respect to a particular embodiment, it is contemplated that numerous variations and modifications are possible in light of the above teachings. It is, therefore, to be understood that the foregoing embodiments are presented by way of example only and that, within the scope of the appended claims and equivalents thereto, the invention may be practiced otherwise than as specifically described.

What is claimed:

1. A digital oversampling DAC system comprising:
   an interpolator receiving a digital input signal having an input sampling frequency and upsampling the digital input signal to produce an upsampled signal, the interpolator having an interpolation ratio, and including control circuitry to set the interpolation ratio such that quantization noise is moved substantially outside of a passband of the input signal;
   a noise shaping modulator, coupled to the interpolator, operating at a clock rate, receiving the upsampled signal and outputting a noise-shaped n-bit digital stream;
   an n-bit DAC, coupled to the modulator, receiving the n-bit digital stream and converting the n-bit digital stream to an analog signal; and
   a low pass filter, coupled to the n-bit DAC, receiving the analog signal and reducing high frequency quantization noise.

2. A system as claimed in claim 1 whereupon a decrease in the input sampling frequency, the interpolation ratio is increased.

3. A system as claimed in claim 2 wherein the interpolator includes:
   at least one upsampling element, upsampling the digital input signal and providing an output; and
   at least one low pass filter, operating at a clock rate, coupled to the at least one upsampling element, receiving the output of the upsampling element, and filtering that output.

4. A system as claimed in claim 3 wherein the control circuitry includes a central processor, coupled to the at least one low pass filter, controlling the clock rate of the at least one low pass filter, to control the interpolation ratio of the interpolator.

5. A system as claimed in claim 4 wherein the at least one upsampling element includes first and second upsampling elements and a sample and hold circuit; and
   wherein the at least one low pass filter includes first and second low pass filters respectively coupled to the first and second upsampling elements.

6. A system as claimed in claim 5 wherein the central processor is coupled to the modulator and controls the clock rate of the modulator to control the interpolation ratio of the interpolator.

7. A system as claimed in claim 6 wherein the central processor includes a user interface through which a user communicates with the central processor to input information relating to the digital input signal.

8. A system as claimed in claim 6 further including rate determining circuitry, coupled to the central processor, receiving the digital input signal and determining the input sampling frequency.

9. A system as claimed in any one of claims 1, 7 or 8 wherein the modulator includes a sigma-delta modulator.

10. A variable upsampling interpolator for a digital oversampling DAC system including a noise shaping modulator and a low pass filter, the interpolator comprising:
  upsampling circuitry receiving a digital input signal having an input sampling frequency and upsampling the digital input signal by an upsampling factor; and
  control circuitry, coupled to the upsampling circuitry, setting the upsampling factor such that quantization noise is moved substantially outside of a passband of the digital input signal.

11. An interpolator as claimed in claim 10 whereupon a decrease in the input sampling frequency, the upsampling factor is increased.

12. An interpolator as claimed in claim 11 wherein the upsampling circuitry includes:
  at least one upsampling element, upsampling the digital input signal and providing an output; and
  at least one low pass filter, operating at a clock frequency, coupled to the at least one upsampling element, receiving the output of the upsampling element, and filtering that output.

13. An interpolator as claimed in claim 12 wherein the control circuitry includes a central processor, coupled to the at least one low pass filter, controlling the clock frequency of the at least one low pass filter.

14. A system as claimed in claim 13 wherein the central processor includes a user interface through which a user communicates with the central processor to input information relating to the digital input signal.

15. A system as claimed in claim 13 further including rate determining circuitry, coupled to the central processor, receiving the digital input signal and determining the input sampling frequency.

16. A variable upsampling interpolator for a digital oversampling DAC system including a noise shaping modulator and a low pass filter, the interpolator comprising:
  means for receiving a digital input signal having an input sampling frequency;
  means, coupled to the means for receiving, for upsampling the digital input signal by an upsampling factor; and
  means, coupled to the means for upsampling, for setting the upsampling factor such that quantization noise is moved substantially outside of a passband of the digital input signal.

17. An interpolator as claimed in claim 16 wherein the means for setting the upsampling factor includes means for increasing the upsampling factor upon a decrease in the input sampling frequency.

18. A method for varying the interpolation ratio of an interpolator within a digital oversampling DAC system, comprising the steps of:
  receiving a digital input signal having an input sampling frequency;
  upsampling the digital input signal by an upsampling factor; and
  setting the upsampling factor such that quantization noise is moved substantially outside of a passband of the digital input signal.

19. A method as claimed in claim 18 wherein the step of setting the upsampling factor includes the step of increasing the upsampling factor upon a decrease in the input sampling frequency.

20. A method as claimed in claim 18 wherein the step of setting the upsampling factor includes the step of using a central processor to set the upsampling factor.

* * * * *